(12) United States Patent
Cho et al.

(10) Patent No.: US 10,530,386 B2
(45) Date of Patent: Jan. 7, 2020

(54) DIGITAL SIGMA-DELTA MODULATOR

(71) Applicant: RAONTECH, Inc., Seongnam-si, Gyeonggi-do (KR)

(72) Inventors: Je-Kwang Cho, Seoul (KR); Min Seok Kim, Seongnam-si (KR)

(73) Assignee: RAONTECH, Inc., Seongnam-si (KR)

( * ) Notice: Subject to any disclaimer, the term of this patent is extended or adjusted under 35 U.S.C. 154(b) by 0 days.

(21) Appl. No.: 16/004,312

(22) Filed: Jun. 8, 2018

(65) Prior Publication Data

US 2018/0358979 A1    Dec. 13, 2018

(30) Foreign Application Priority Data

Jun. 8, 2017  (KR) .................. 10-2017-0071775

(51) Int. Cl.
*H03M 3/00* (2006.01)

(52) U.S. Cl.
CPC .................. *H03M 3/466* (2013.01)

(58) Field of Classification Search
CPC ........ G06F 7/507; G06F 7/5338; G06F 7/509; G06F 7/508; G06F 7/5443; G06F 7/57; G06F 7/50; G06F 7/505; G06F 7/575; H03M 1/12; H03M 1/1215; H03M 1/1009; H03M 1/1245; H03M 1/1225; H03M 3/468; H03M 1/121; H03M 3/422; H03M 3/50; H03M 3/30; H03M 3/47
USPC .......................... 341/143; 708/714, 708, 629
See application file for complete search history.

(56) References Cited

U.S. PATENT DOCUMENTS

| | | | | |
|---|---|---|---|---|
| 5,546,018 A * | 8/1996 | New | ........................ | G06F 7/503 326/38 |
| 5,805,479 A * | 9/1998 | Tang | ........................ | H03H 17/04 708/316 |
| 6,160,817 A * | 12/2000 | Wille | ................... | H04Q 11/0457 370/445 |
| 6,167,421 A * | 12/2000 | Meeker | .................. | G06F 7/5277 708/626 |
| 6,321,366 B1 * | 11/2001 | Tseng | ................... | G06F 17/5022 326/94 |
| 6,359,519 B1 * | 3/2002 | Farrow | ................. | H03K 3/0315 327/156 |
| 7,330,869 B2 * | 2/2008 | Skull | ........................ | G06F 7/507 708/708 |
| 2006/0242221 A1 * | 10/2006 | McDaniel | ............... | G06F 7/509 708/700 |
| 2007/0233769 A1 * | 10/2007 | Moshier | ................... | G06F 7/728 708/491 |
| 2011/0210880 A1 * | 9/2011 | Hainz | .................. | H03M 1/1225 341/141 |

(Continued)

*Primary Examiner* — Linh V Nguyen
(74) *Attorney, Agent, or Firm* — Finnegan, Henderson, Farabow, Garrett & Dunner, LLP

(57) ABSTRACT

A digital sigma-delta modulator may be provided that includes: a multiplexer which receives N-bit input data from each of M number of input terminals and sequentially outputs; an adder which outputs carry out (CO) data and N-bit added data obtained by adding the N-bit input data and N-bit added data output in a previous cycle; a memory which divides the N-bit added data output from the adder into A-bit added data and (N–A)-bit added data and stores the A-bit added data and the (N–A)-bit added data; and a demultiplexer which receives the output carry out (CO) data and outputs to each of M number of output terminals.

9 Claims, 13 Drawing Sheets

(56) References Cited

U.S. PATENT DOCUMENTS

2016/0179468 A1* 6/2016 Cuffney .................... G06F 7/50
                                                    708/203
2017/0017506 A1* 1/2017 Boshernitsan .......... G06F 9/455

* cited by examiner

DIGITAL SIGMA-DELTA MODULATOR

CROSS REFERENCE TO RELATED APPLICATION

The disclosure claims the benefits of priority to Korean patent application number 10-2017-0071775, filed Jun. 8, 2017, which is incorporated herein by reference in its entirety.

TECHNICAL FIELD

The present disclosure relates to a digital sigma-delta modulator and more particularly to a digital sigma-delta modulator for processing a plurality of inputs and outputs.

BACKGROUND

In general, a sigma-delta modulation method is one of methods for converting an analog signal derived from a delta modulation method into a digital signal and is able to obtain a high resolution.

The sigma-delta modulation method is widely used in many wired/wireless communications systems. Korean Laid-Open Patent Application No. 10-2005-0010954 proposes the third order sigma delta modulator in a frequency synthesizer.

FIG. 1 is a view showing a conventional digital sigma-delta modulator which processes one input/output.

Referring to FIG. 1, the conventional digital sigma-delta modulator (SDM) is implemented with one adder 10 and one memory 20, converts N-bit input data into oversampled one bit output data, and then outputs the converted one bit output data.

The converted one bit output data is passed through a predetermined digital filter, and thus, a specific frequency component of the N-bit input data is obtained very accurately.

FIGS. 2a to 2b are views showing the conventional digital sigma-delta modulator which processes a plurality of inputs and outputs.

Referring to FIG. 2a, M number of the digital sigma-delta modulators may be used to operate simultaneously for the respective M pairs of inputs and outputs. Thus, hardware becomes larger because the number of the digital sigma-delta modulators required is the same as that of the pairs of inputs and outputs to be processed.

Referring to FIG. 2b, for the purpose of processing a plurality of inputs and outputs, the conventional digital sigma-delta modulator operates with one SDM and multiplexers (MUXs) and demultiplexers (De-MUXs).

When M number of inputs and outputs are processed by using the multiplexer, the size of the entire hardware may become smaller because in this case only one adder, instead of M number of adders, is used.

However, since M number of memories are still used, the reduced amount of hardware is necessarily limited.

SUMMARY OF THE DISCLOSURE

The embodiments of the present disclosure are designed to solve the above problems of the conventional technology. The object of the present disclosure is to provide a digital sigma-delta modulator which processes a plurality of inputs and outputs. In the digital sigma-delta modulator, a plurality of N-bit memories are implemented with a plurality of A-bit memories and one (N−A)-bit memory.

However, the object of the present disclosure is not limited to the above description and can be variously extended without departing from the scope and spirit of the present disclosure.

The present disclosure provides a digital sigma-delta modulator including: a multiplexer which receives N-bit input data from each of M number of input terminals and sequentially outputs the N-bit input data; an adder which outputs carry out (CO) data and N-bit added data obtained by adding the N-bit input data and N-bit added data output in a previous cycle; a memory which divides the N-bit added data output from the adder into A-bit added data and (N−A)-bit added data and stores the A-bit added data and the (N−A)-bit added data; and a demultiplexer which receives the output carry out (CO) data and outputs to each of M number of output terminals.

The adder may include: a first input terminal which receives the N-bit input data; a second input terminal which receives the N-bit added data output in the previous cycle; a first output terminal which outputs N-bit added data obtained by adding the N-bit input data and the N-bit added data output in the previous cycle and transmits the N-bit added data as a feedback to the second input terminal; and a second output terminal which outputs the carry out (CO) data.

The memory may include: an input side demultiplexer which outputs the A-bit added data out of the N-bit added data received from the first output terminal of the adder to M number of output terminals; M number of individual memories which stores the A-bit added data received from each of M number of output terminals of the input side demultiplexer; and an output side multiplexer which sequentially outputs the A-bit added data received from each of the M number of the individual memories to the second input terminal of the adder.

The memory may further include one shared memory which stores the (N−A)-bit added data out of the N-bit added data received from the first output terminal of the adder.

The A-bit may have a predetermined value equal to or less than the N-bit.

The larger an oversampling ratio for the N-bit input data is, the smaller the value of the A-bit may be set to, and the smaller the oversampling ratio is, the larger the value of the A-bit may be set to.

The present disclosure provides a digital sigma-delta modulator including: an adder which receives sequentially M number of N-bit input data and outputs carry out (CO) data and N-bit added data obtained by adding the received N-bit input data and N-bit added data output in a previous cycle; and a memory which divides the N-bit added data output from the adder into A-bit added data and (N−A)-bit added data and stores the A-bit added data and the (N−A)-bit added data.

The present disclosure provides a digital sigma-delta modulator including: an adder which receives N-bit input data and outputs N-bit added data obtained by adding the received N-bit input data and N-bit added data output in a previous cycle; and a memory which divides the N-bit added data output from the adder into A-bit added data and (N−A)-bit added data and stores the A-bit added data and the (N−A)-bit added data.

The memory may further include: an input side demultiplexer which outputs the A-bit added data out of the N-bit added data received from the adder; M number of individual memories which stores the A-bit added data received from the input side demultiplexer; and an output side multiplexer which sequentially outputs the A-bit added data received from each of the M number of the individual memories.

The memory may further include: an input side demultiplexer which outputs the A-bit added data out of the N-bit added data received from the adder to M number of output terminals; M number of individual memories which stores the A-bit added data received from each of M number of put terminals of the input side demultiplexer; and an output side multiplexer which sequentially outputs the A-bit added data received from each of the M number of the individual memories.

The memory may further include one shared memory which stores the (N−A)-bit added data out of the N-bit added data received from the adder.

As such, the present disclosure provides the digital sigma-delta modulator which processes a plurality of inputs and outputs. A plurality of N-bit memories are implemented with a plurality of A-bit memories and one (N−A)-bit memory. The performance that is required to implement the digital SDM can be prevented from being degraded and the memory capacity can be effectively reduced.

However, the effect of the present disclosure is not limited to the above description and can be variously extended without departing from the scope and spirit of the present disclosure.

DETAILED DESCRIPTION

Figure 1:
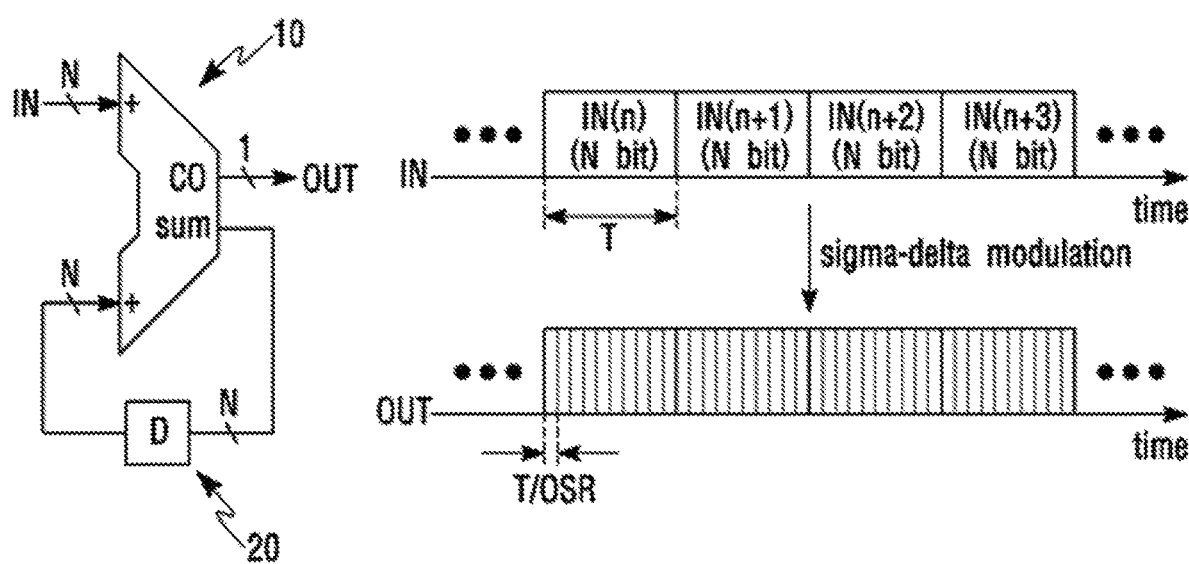
FIG. 1 is a view showing a conventional digital sigma-delta modulator which processes one input/output.

The following detailed description of the present disclosure shows specified embodiments of the present disclosure and will be provided with reference to the accompanying drawings. The embodiments will be described in enough detail that those skilled in the art are able to embody the present disclosure. It should be understood that various embodiments of the present disclosure are different from each other and need not be mutually exclusive. For example, a specific shape, structure and properties, which are described in this disclosure, may be implemented in other embodiments without departing from the spirit and scope of the present disclosure with respect to one embodiment. Also, it should be noted that positions or placements of individual components within each disclosed embodiment may be changed without departing from the spirit and scope of the present disclosure. Therefore, the following detailed description is not intended to be limited. If adequately described, the scope of the present disclosure is limited only by the appended claims of the present disclosure as well as all equivalents thereto. Similar reference numerals in the drawings designate the same or similar functions in many aspects.

Hereafter, a digital sigma-delta modulator (SDM) according to exemplary embodiments of the present disclosure will be described with reference to the accompanying drawings.

Particularly, according to the embodiments of the present disclosure, while the digital sigma-delta modulator which processes a plurality of inputs and outputs is implemented, proposed is a structure of a new digital sigma-delta modulator in which a plurality of N-bit memories are implemented with a plurality of A-bit memories and one (N−A)-bit memory.

Figure 3:
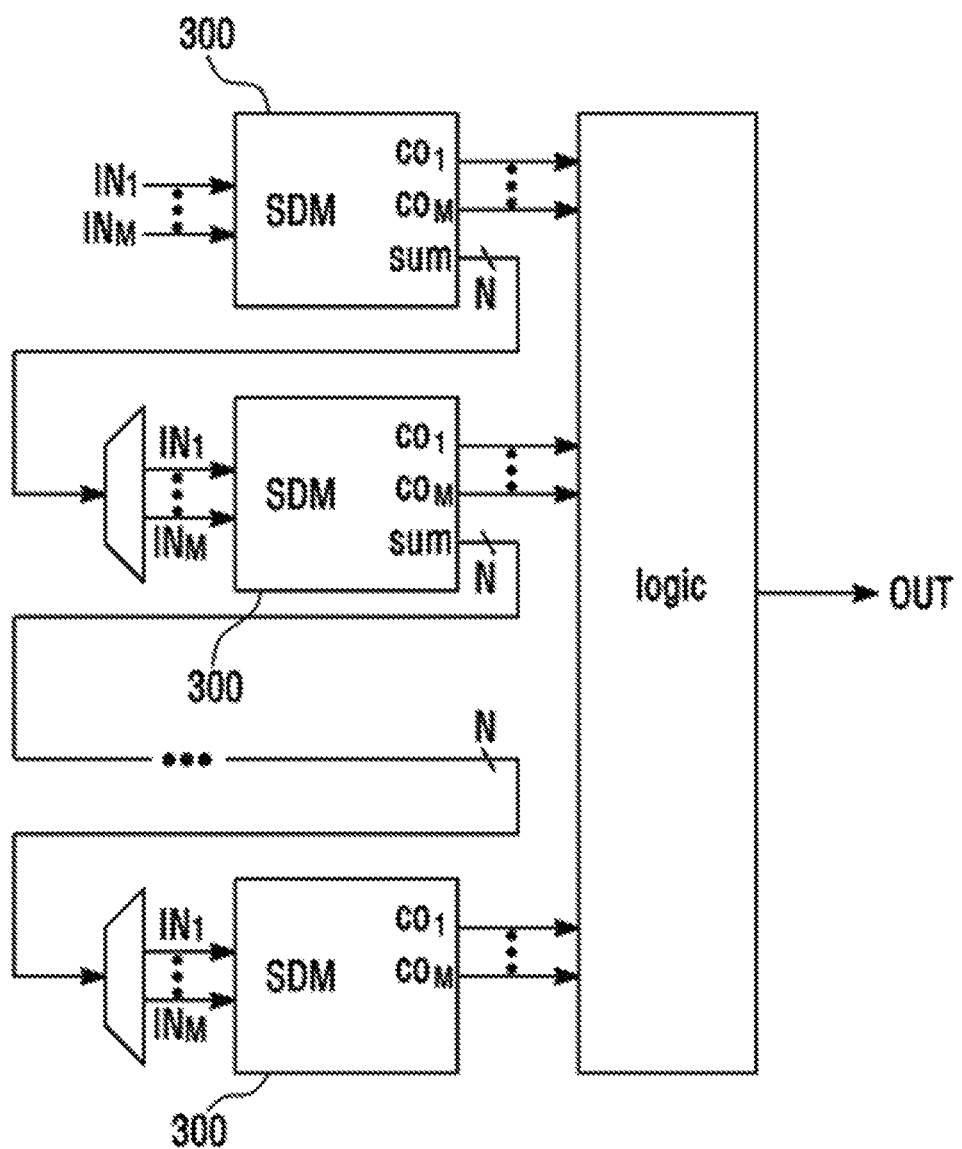
FIG. 3 is a view showing an L-th order digital sigma-delta modulator according to embodiments of the present disclosure.

FIG. 3 is a view showing an L-th order digital sigma-delta modulator according to embodiments of the present disclosure.

Referring to FIG. 3, the L-th order digital sigma-delta modulator according to the embodiments of the present disclosure may be comprised of a plurality of cascaded first order digital sigma-delta modulators 300.

Figure 4:
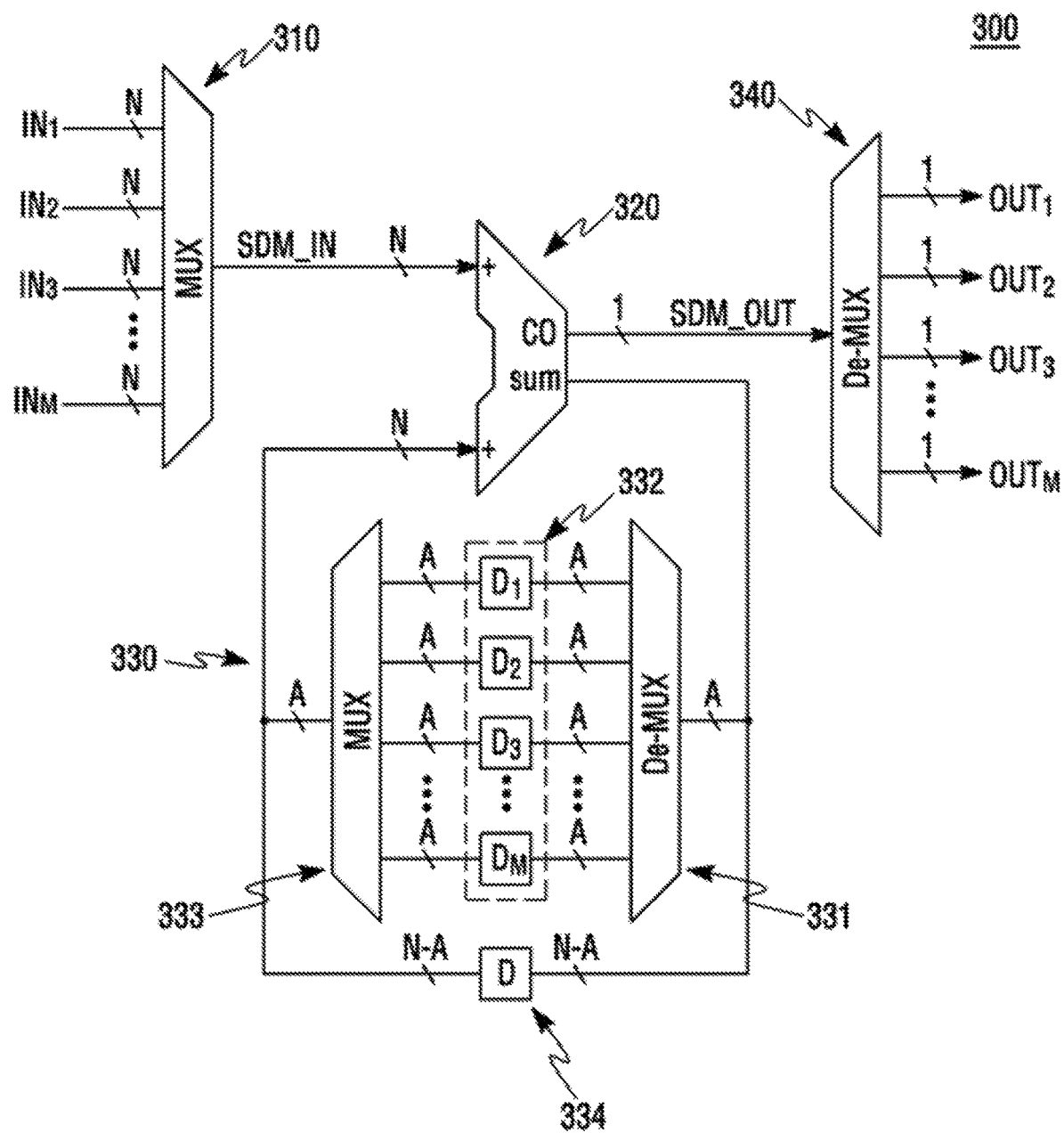
FIG. 4 is a view showing the digital sigma-delta modulator according to the embodiments of the present disclosure.

FIG. 4 is a view showing the first order digital sigma-delta modulator according to the embodiments of the present disclosure.

Referring to FIG. 4, the first order digital sigma-delta modulator 300 according to the embodiments of the present disclosure may include a multiplexer (MUX) 310, an adder 320, a memory 330, and a demultiplexer (De-MUX) 340.

The multiplexer 310 may receive in parallel N-bit input data (IN1, IN2, IN3, . . . , and INM) from each of M number of input terminals and may sequentially output the received N-bit input data.

The adder 320 may receive the N-bit input data from the multiplexer 310. The adder 320 may output one-bit carry out (CO) data and N-bit added data obtained by adding the received N-bit input data and N-bit added data output in a previous cycle.

The adder 320 may include a first input terminal which receives the N-bit input data, a second input terminal which receives, as a feedback, the N-bit added data output in the previous cycle, a first output terminal which outputs N-bit added data obtained by adding the N-bit input data and the N-bit added data output in the previous cycle and transmits the N-bit added data as a feedback to the second input terminal, and a second output terminal which outputs the one-bit carry out (CO) data.

Here, the one-bit carry out (CO) data may be an output of the digital sigma-delta modulator.

The memory 330 may divide the N-bit added data output from the adder into A-bit added data and (N−A)-bit added data and store the A-bit added data and the (N−A)-bit added data.

Here, the structural characteristics of the digital sigma-delta modulator will be described as follows. That is, in FIG. 2b, when SDM_IN=IN1, the memory which operates in a feedback loop of the SDM is only N-bit D1, and the remaining N-bit D2 to DM perform only the function of maintaining existing data.

If the N-bit D1 maintains only a portion of the most significant bits (MSBs) without maintaining all of the N-bit data, it can be thought that a small error signal is introduced.

If the size of the error is small enough not to degrade the overall performance of the SDM, the size of the memory can be reduced by storing only a portion of the N-bit data.

In the embodiments of the present disclosure, the memory is intended to be configured by using such a principle. The memory 330 may be implemented with an input side demultiplexer 331, M number of A-bit individual memories 332, an output side multiplexer 333, and one (N−A)-bit shared memory 334.

Here, the A-bit may have a predetermined value equal to or less than N-bit.

The input side demultiplexer 331 may receive the A-bit added data out of the N-bit added data output from the adder 320 and may output to the individual memories D1, D2, D3, . . . , and DM on the corresponding feedback loop.

M number of the individual memories 332 are provided. The individual memory 332 may store A-bit added data received from the input side demultiplexer 331.

The output side multiplexer 333 may sequentially output the A-bit added data, as a feedback, received from each of M number of the individual memories D1, D2, D3, . . . , and DM.

One shared memory 334 is provided. The shared memory 334 may store the (N−A)-bit added data out of the N-bit added data output from the adder 320. The shared memory 334 may be used in common in all of the output data.

The demultiplexer 340 may receive the one-bit carry out (CO) data output from the adder 320 and may output the received one-bit carry out (CO) data into each of M number of output terminals.

Figure 5:
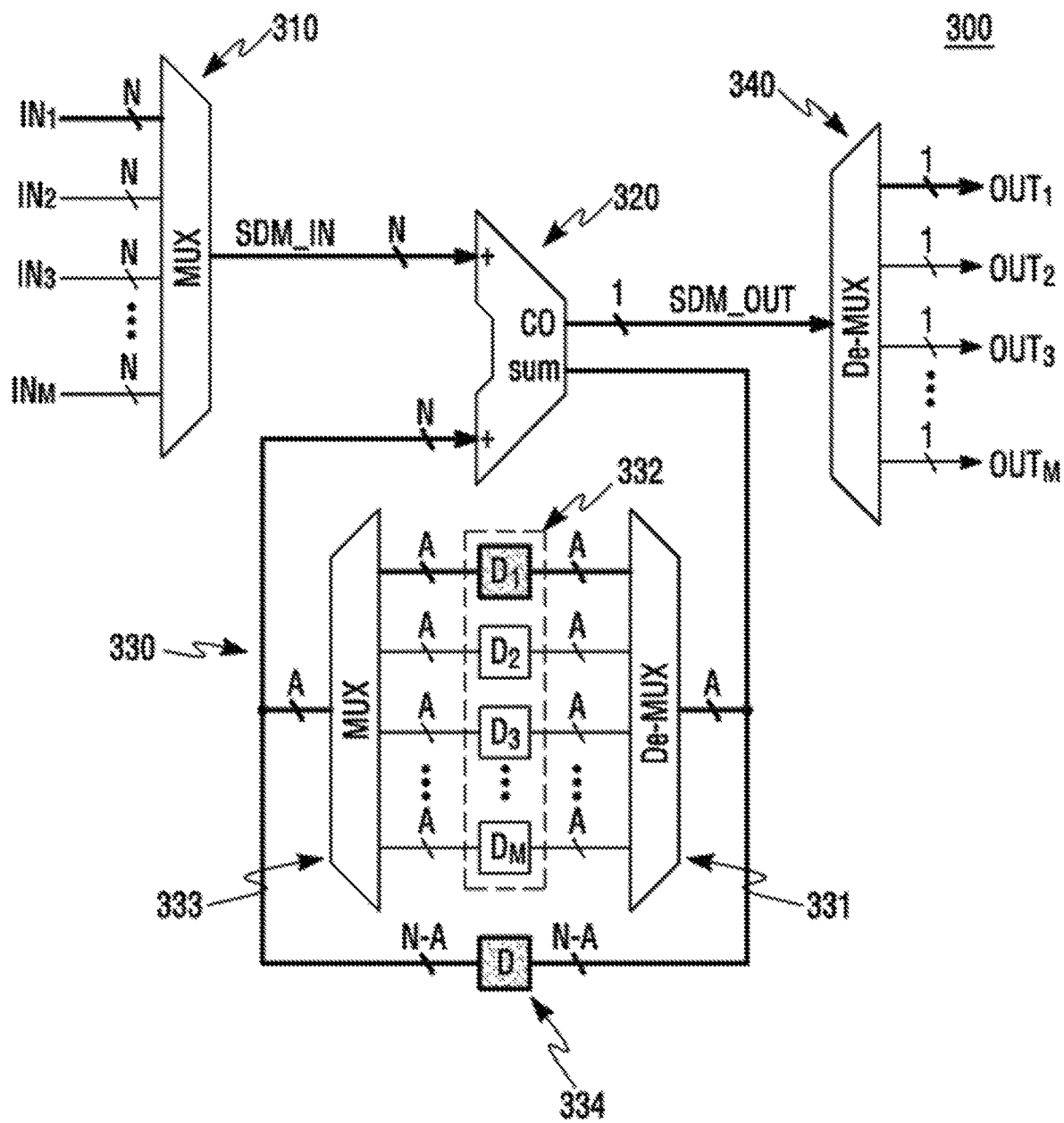
FIG. 5 is a view showing an operation principle of the digital sigma-delta modulator shown in FIG. 4.

FIG. 5 is a view showing an operation principle of the digital sigma-delta modulator shown in FIG. 4.

As shown in FIG. 5, when SDM_IN=IN1, the digital sigma-delta modulators 300 according to the embodiments of the present disclosure may use the shared memory (N−A)-bit D and the individual memory A-bit D1 on the feedback loop.

Figure 2A:
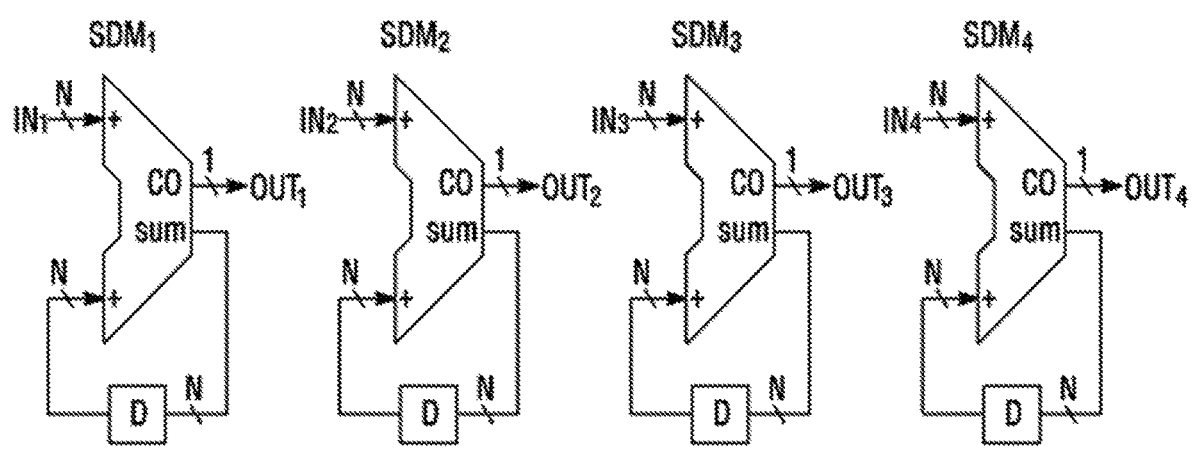
FIGS. 2a to 2b are views showing the conventional digital sigma-delta modulator which processes a plurality of inputs and outputs.
Figure 2B:
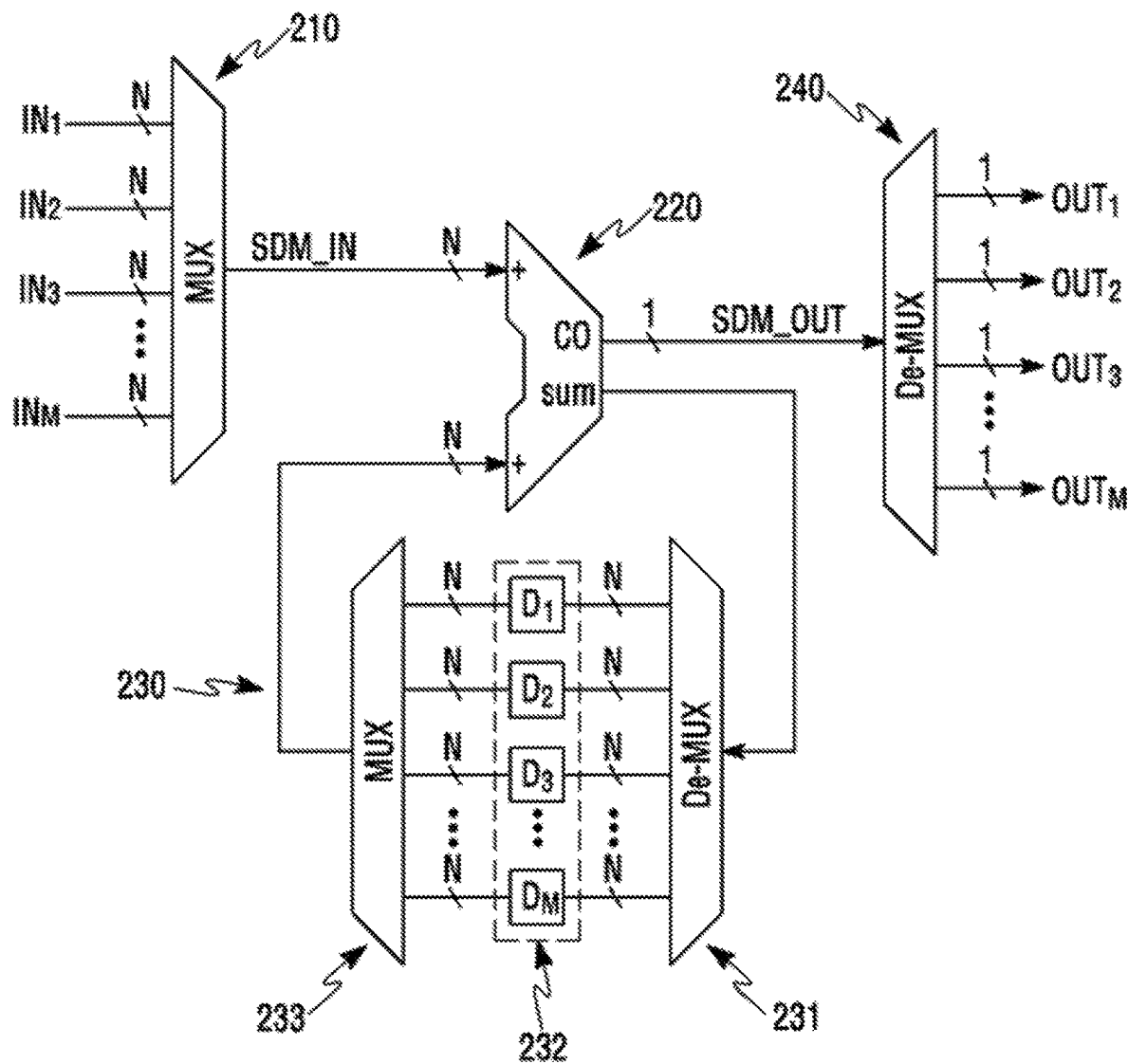

In this way, the digital sigma-delta modulators according to the embodiments of the present disclosure may use the shared memory (N−A)-bit D and the individual memory A-bit DM on the feedback loop in an alternating manner until SDM The total size MEM2 of the configured memory according to the embodiments of the present disclosure becomes ((M×A)+(N−A)) bit, and then may be reduced more than MEM1=(M×N) bit, i.e., the memory size of the SDM of FIG. 2b. Therefore, compared with the memory size of the SDM of FIG. 2b, a reduced amount of the memory size of the SDM according to the embodiments of the present disclosure can be defined as (MEM1−MEM2)/MEM1×100 [%].

Figure 6:
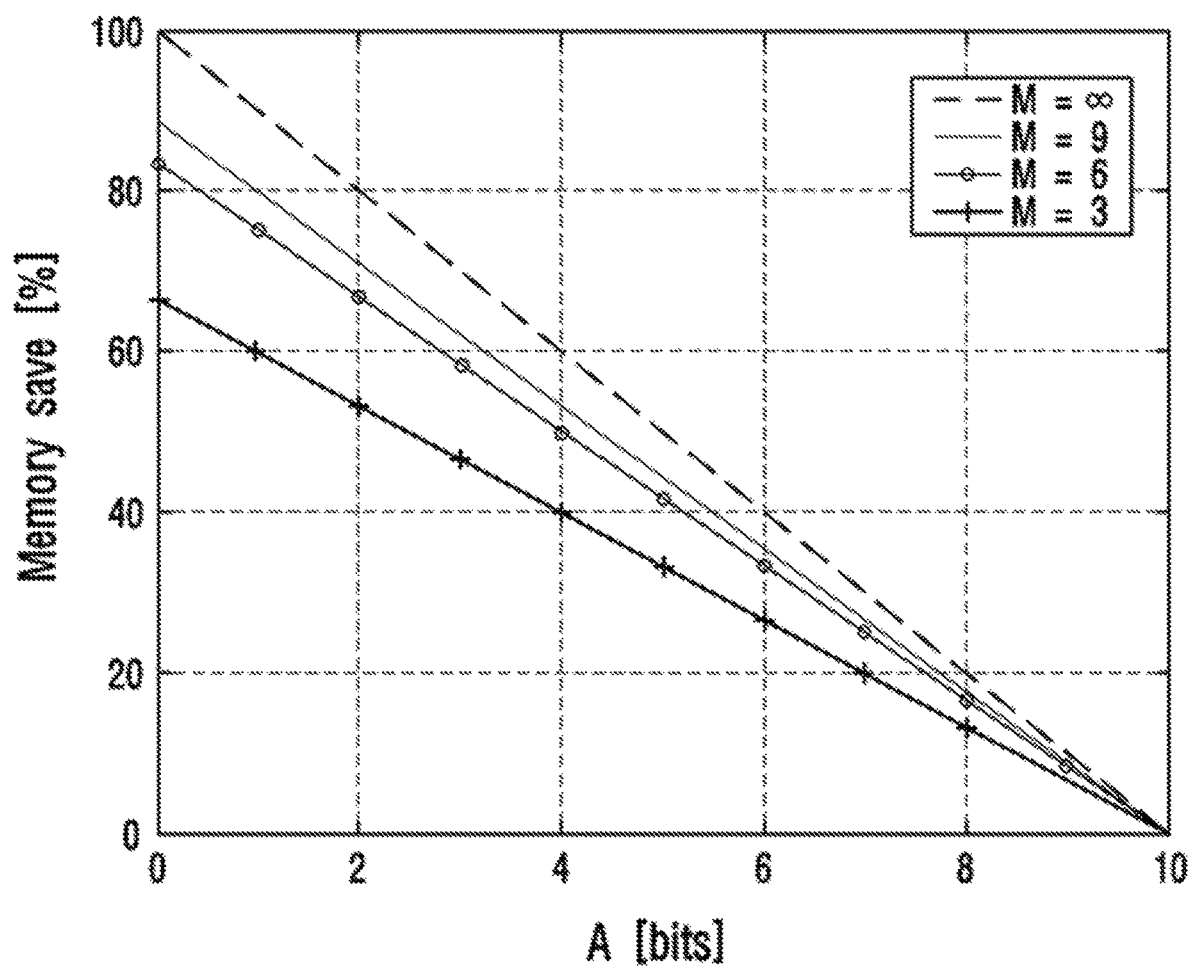
FIG. 6 is a view showing a reduced amount of a memory of the digital sigma-delta modulator shown in FIG. 4.

FIG. 6 is a view showing the reduced amount of the memory of the digital sigma-delta modulator shown in FIG. 4.

FIG. 6 shows that the reduced amount of the memory according to the value of "A" is varied based on the number of inputs and outputs M, when N=10. It can be seen that the reduced amount of the total memory of the SDM increases with the increase of the M.

Also, the smaller the size "A" of each of the M number of the memories D1 to DM, the smaller the total memory size of the SDM, however, the larger the size of the introduced error.

Also, the actual size of the memory on the feedback loop for each input of the SDM is N-bit during oversampling ratio (OSR)-1 clocks out of OSR number of clocks and is A-bit during one clock. Accordingly, the larger the OSR, the relatively smaller the size of the introduced error.

Therefore, when the larger the OSR is, the smaller the value of the A-bit is set to and when the smaller the OSR is, the larger the value of the A-bit is set to, the memory size can be reduced without having a large influence on the overall performance.

Figure 7:
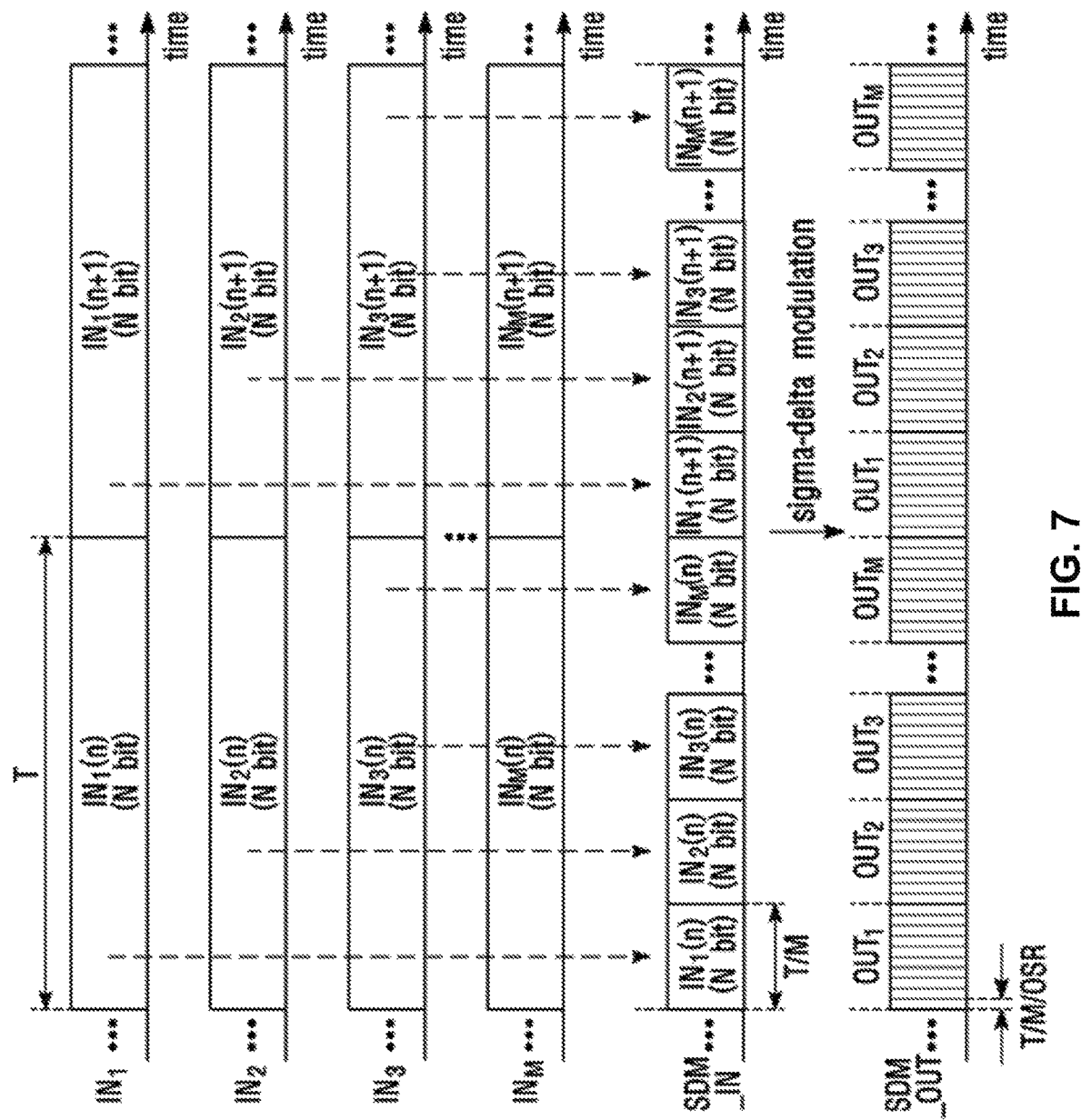
FIG. 7 is a timing diagram of the digital sigma-delta modulator shown in FIG. 4.

FIG. 7 is a timing diagram of the digital sigma-delta modulator shown in FIG. 4.

Referring to FIG. 7, the N-bit input data IN1, IN2, IN3, . . . , and INM are sequentially applied as SDM_IN data to the adder through the multiplexer because the N-bit input data IN1, IN2, IN3, . . . , and INM are maintained during a time period T. Here, an internal memory configuration (a pair of individual memory and shared memory) is also changed into {D1, D}~{DM, D} in accordance with each input.

The N-bit input data IN changes once during the time period T. The N-bit input data SDM_IN changes once during a time period T/M. One-bit output data SDM_OUT changes once per T/M/OSR.

Here, the OSR means a predetermined oversampling ratio and has an integer value.

As such, while the one-bit carry out (CO) data SDM_OUT changes once per T/M/OSR in the SDM according to the embodiments of the present disclosure, the one-bit carry out (CO) data SDM_OUT changes once per T/OSR in the SDM of FIG. 2a. Therefore, the SDM according to the embodiments of the present disclosure may operate M times faster than the SDM of FIG. 2a.

Furthermore, the memory of the SDM according to the embodiments of the present disclosure is implemented with M number of A-bit individual memories and one (N−A)-bit shared memory, so that the total memory capacity can be reduced.

Figure 8:
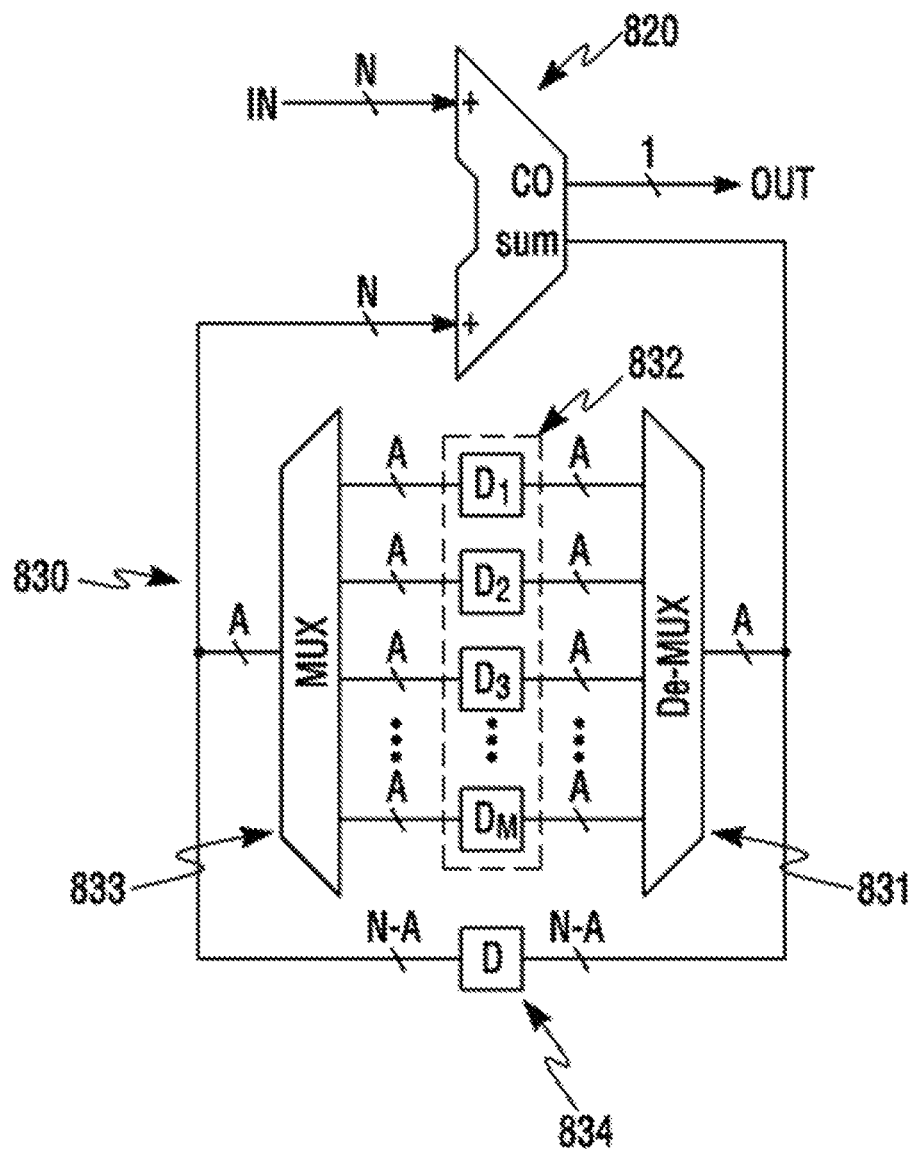
FIG. 8 is a view showing a digital sigma-delta modulator according to other embodiments of the present disclosure.

FIG. 8 is a view showing a first order digital sigma-delta modulator according to other embodiments of the present disclosure.

Referring to FIG. 8, the first order digital sigma-delta modulator according to the embodiments of the present disclosure may include an adder 720 and a memory 730. The memory 730 may be implemented with a demultiplexer 731, M number of A-bit individual memories 732, a multiplexer 733, and one (N−A)-bit shared memory 734.

Since the structure and function of the configured SDM according to the embodiments of the present disclosure are the same as those of the SDM described in FIG. 3, the descriptions thereof will be omitted. However, when the digital sigma-delta modulator receives data in series and outputs data in series, the multiplexer and the demultiplexer are not used.

That is to say, the adder 720 may receive M number of the N-bit input data in series. The adder 720 may output the one-bit carry out (CO) data and N-bit output data obtained by adding the received N-bit input data and N-bit output data output in the previous cycle.

Figure 9A:
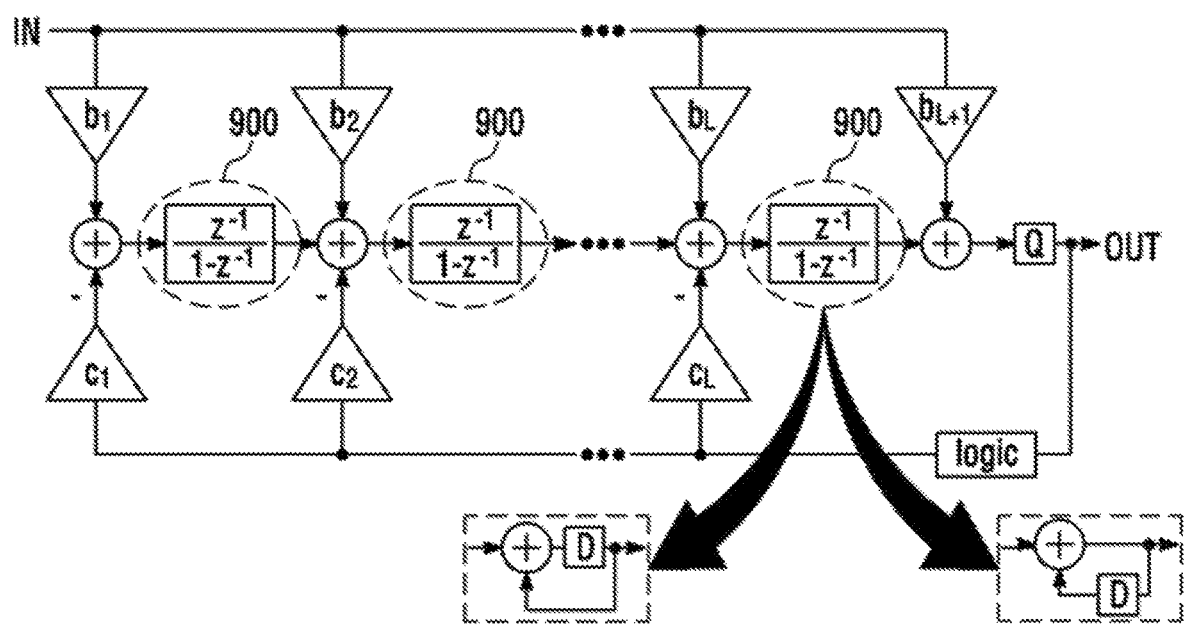
FIGS. 9a to 9b are views showing an L-th order digital sigma-delta modulator according to the embodiments of the present disclosure.
Figure 9B:
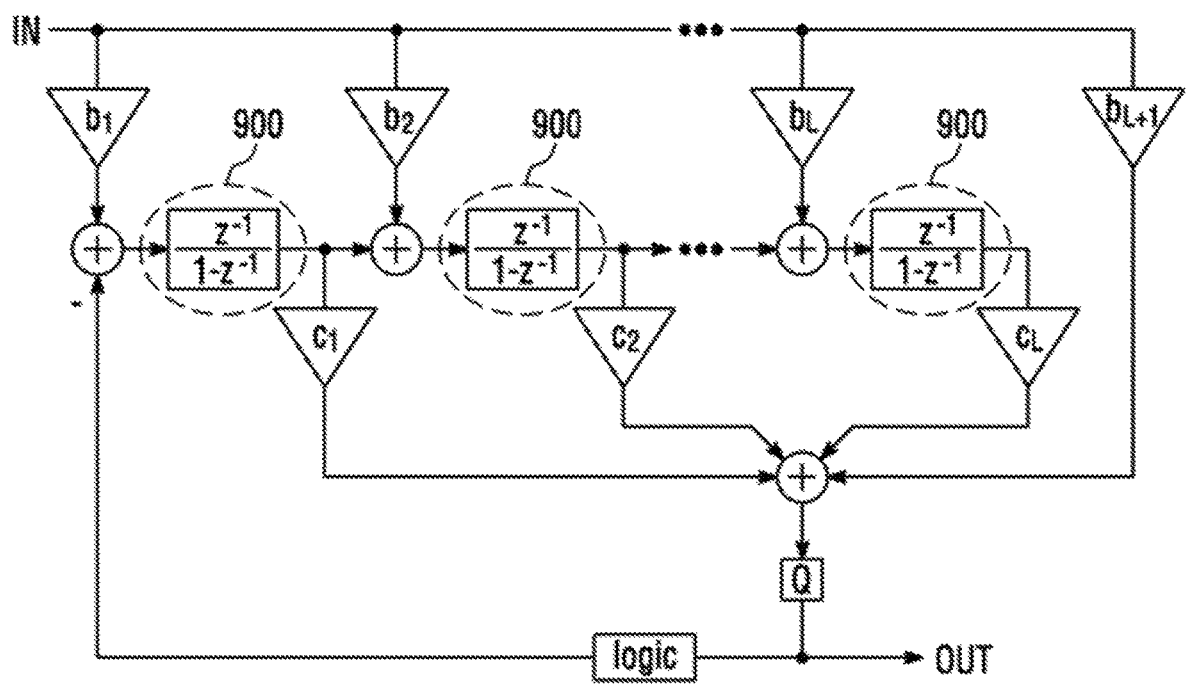

FIGS. 9a to 9b are views showing an L-th order digital sigma-delta modulator according to the embodiments of the present disclosure.

Referring to FIGS. 9a to 9b, the L-th order digital sigma-delta modulator according to the embodiments of the present disclosure may be configured by using digital accumulators 900.

Figure 10A:
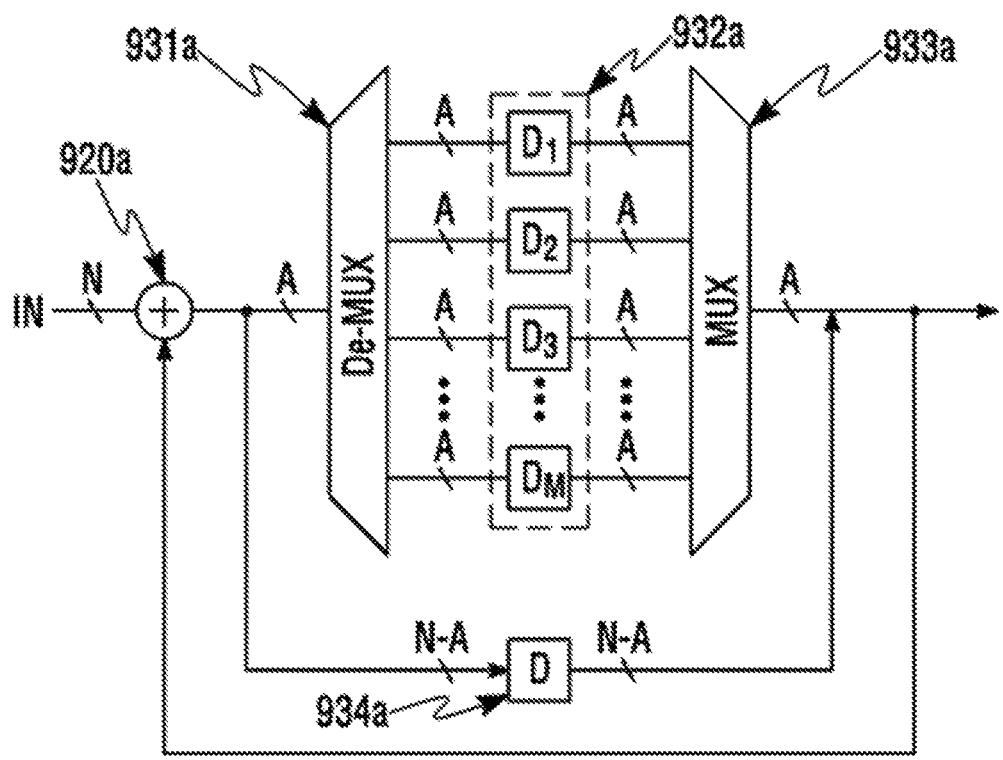
FIGS. 10a to 10b are views showing a digital accumulator according to the embodiments of the present disclosure.
Figure 10B:
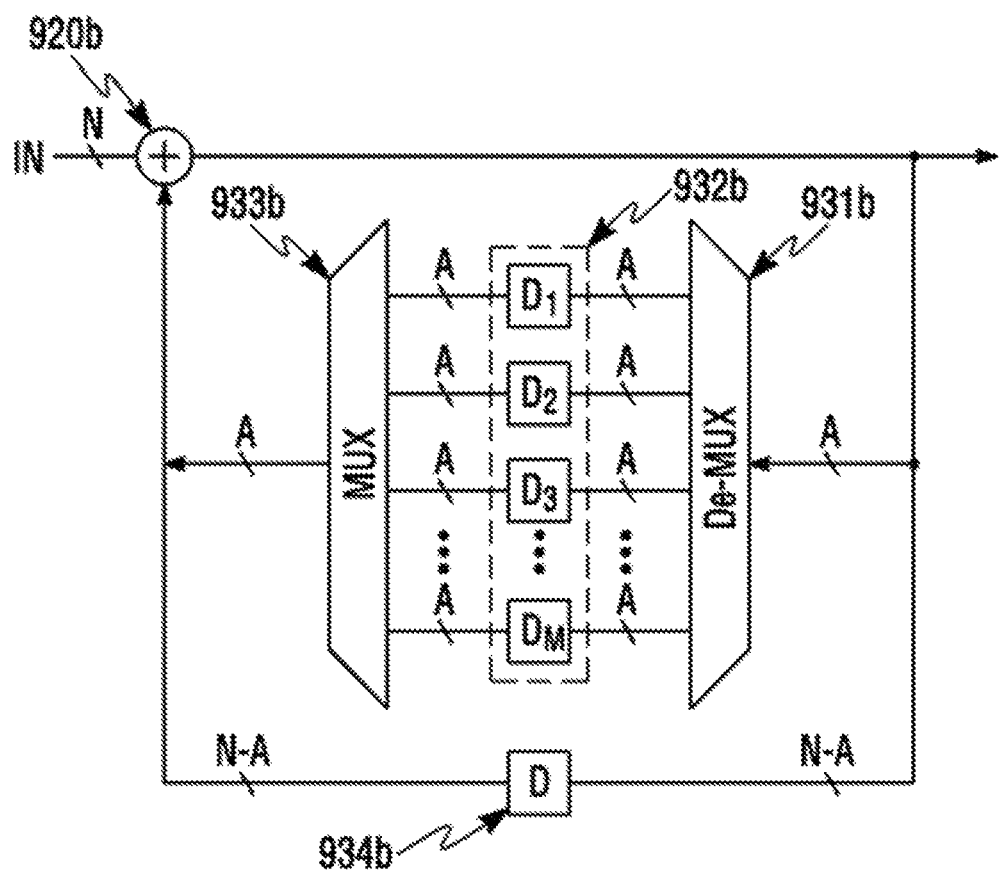

FIGS. 10a to 10b are views showing the digital accumulator according to the embodiments of the present disclosure.

Referring to FIG. 10a, the digital accumulator 900 according to the embodiments of the present disclosure has a feed forward path with delay. The digital accumulator 900 may include an adder 920a and a memory 930a. The memory 930a may be implemented with an input side demultiplexer 931a, M number of A-bit individual memories 932a, an output side multiplexer 933a, and one (N–A)-bit shared memory 934a.

Referring to FIG. 10b, the digital accumulator 900 according to the embodiments of the present disclosure has a feed forward path without delay. The digital accumulator 900 may include an adder 920b and a memory 930b. The memory 930b may be implemented with an input side demultiplexer 931b, M number of A-bit individual memories 932b, an output side multiplexer 933b, and one (N–A)-bit shared memory 934b.

Since the operation principles of the configured memories 930a and 930b are the same as those of the memory 330 described in FIG. 4, detailed descriptions thereof will be omitted.

The features, structures and effects and the like described in the embodiments are included in one embodiment of the present disclosure and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present disclosure.

Although embodiments of the present disclosure were described above, these are just examples and do not limit the present disclosure. Further, the present disclosure may be changed and modified in various ways, without departing from the essential features of the present disclosure, by those skilled in the art. For example, the components described in detail in the embodiments of the present disclosure may be modified. Further, differences due to the modification and application should be construed as being included in the scope and spirit of the present disclosure, which is described in the accompanying claims.

What is claimed is:

1. A digital sigma-delta modulator comprising:
   a multiplexer which receives N-bit input data from each of M number of input terminals and sequentially outputs the N-bit input data;
   an adder which outputs carry out (CO) data and N-bit added data obtained by adding the N-bit input data and N-bit added data output in a previous cycle;
   a memory which divides the N-bit added data output from the adder into A-bit added data and (N-A)-bit added data and stores the A-bit added data and the (N-A)-bit added data; and
   a demultiplexer which receives the output carry out (CO) data and outputs to each of M number of output terminals.

2. The digital sigma-delta modulator of claim 1, wherein the adder comprises:
   a first input terminal which receives the output N-bit input data;
   a second input terminal which receives the N-bit added data output in the previous cycle;
   a first output terminal which outputs N-bit added data obtained by adding the N-bit input data and the N-bit added data output in the previous cycle and transmits the N-bit added data as a feedback to the second input terminal; and
   a second output terminal which outputs the carry out (CO) data.

3. The digital sigma-delta modulator of claim 2, wherein the memory comprises:
   an input side demultiplexer which outputs the A-bit added data out of the N-bit added data received from the first output terminal of the adder to M number of output terminals;
   M number of individual memories which stores the A-bit added data received from each of M number of output terminals of the input side demultiplexer; and
   an output side multiplexer which sequentially outputs the A-bit added data received from each of the M number of the individual memories to the second input terminal of the adder.

4. The digital sigma-delta modulator of claim 3, wherein the memory further comprises one shared memory which stores the (N-A)-bit added data out of the N-bit added data received from the first output terminal of the adder.

5. The digital sigma-delta modulator of claim 1, wherein the A-bit has a predetermined value equal to or less than the N-bit.

6. The digital sigma-delta modulator of claim 5, wherein the larger an oversampling ratio for the N-bit input data is, the smaller the value of the A-bit is set to, and the smaller the oversampling ratio is, the larger the value of the A-bit is set to.

7. A digital sigma-delta modulator comprising:
   an adder which receives sequentially M number of N-bit input data and outputs carry out (CO) data and N-bit added data obtained by adding the received N-bit input data and N-bit added data output in a previous cycle; and
   a memory which divides the N-bit added data output from the adder into A-bit added data and (N-A)-bit added data and separately stores the A-bit added data and the (N-A)-bit added data,
   wherein the memory comprises:
      an input side demultiplexer which outputs the A-bit added data out of the N-bit added data received from the adder to M number of output terminals;
      M number of individual memories which stores the A-bit added data received from each of M number of output terminals of the input side demultiplexer;
      an output side multiplexer which sequentially outputs the A-bit added data received from each of the M number of the individual memories; and
      one shared memory which stores the (N-A)-bit added data out of the N-bit added data received from the adder.

8. A digital sigma-delta modulator comprising:
   an adder which receives N-bit input data and outputs N-bit added data obtained by adding the received N-bit input data and N-bit added data output in a previous cycle; and
   a memory which divides the N-bit added data output from the adder into A-bit added data and (N-A)-bit added data and separately_stores the A-bit added data and the (N-A)-bit added data,
   wherein the memory comprises:
      an input side demultiplexer which outputs the A-bit added data out of the N-bit added data received from the adder;
      M number of individual memories which stores the A-bit added data received from the input side demultiplexer;

an output side multiplexer which sequentially outputs the A-bit added data received from each of the M number of the individual memories; and one shared memory which stores the (N-A)-bit added data out of the N-bit added data received from the adder.

9. A digital sigma-delta modulator comprising:

an adder which receives N-bit input data and outputs N-bit added data obtained by adding the received N-bit input data and N-bit added data output in a previous cycle; and a memory which divides the N-bit added data output from the adder into A-bit added data and (N-A)-bit added data and separately stores the A-bit added data and the (N-A)-bit added data, wherein the memory comprises:

an input side demultiplexer which outputs the A-bit added data out of the N-bit added data received from the adder to M number of output terminals;

M number of individual memories which stores the A-bit added data received from each of M number of output terminals of the input side demultiplexer; and an output side multiplexer which sequentially outputs the A-bit added data received from each of the M number of the individual memories; and one shared memory which stores the (N-A)-bit added data out of the N-bit added data received from the adder.

* * * * *